(12) United States Patent
Yoon (10) Patent No.: US 8,270,236 B2
(45) Date of Patent: Sep. 18, 2012

(54) SEMICONDUCTOR MEMORY DEVICE

(75) Inventor: Hyuck-Soo Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 54 days.

(21) Appl. No.: 12/433,930

(22) Filed: May 1, 2009

(65) Prior Publication Data

US 2010/0165763 A1    Jul. 1, 2010

(30) Foreign Application Priority Data

Dec. 30, 2008  (KR) ........................ 10-2008-0137384

(51) Int. Cl.
G11C 7/00 (2006.01)
G11C 8/00 (2006.01)

(52) U.S. Cl. ........ 365/194; 365/205; 365/207; 365/208; 365/222; 365/230.03; 365/230.06

(58) Field of Classification Search ................... 365/194, 365/185.11, 230.03, 230.06, 205, 207, 208, 365/189.09, 222; 327/291
See application file for complete search history.

(56) References Cited

U.S. PATENT DOCUMENTS

| | | | | | |
|---|---|---|---|---|---|
| 5,831,910 | A | * | 11/1998 | Suzuki et al. ................ | 365/207 |
| 5,953,280 | A | * | 9/1999 | Matsui ..................... | 365/230.03 |
| 5,959,929 | A | * | 9/1999 | Cowles et al. ............. | 365/230.03 |
| 5,970,010 | A | * | 10/1999 | Hira et al. .................. | 365/194 |
| 6,064,621 | A | * | 5/2000 | Tanizaki et al. ........... | 365/230.03 |
| 6,091,659 | A | * | 7/2000 | Watanabe et al. ......... | 365/230.03 |
| 6,134,178 | A | * | 10/2000 | Yamazaki et al. ........ | 365/230.03 |
| 6,166,977 | A | * | 12/2000 | Saitoh et al. ............... | 365/205 |
| 6,262,930 | B1 | * | 7/2001 | Mori et al. ................. | 365/205 |
| 6,310,815 | B1 | * | 10/2001 | Yamagata et al. ......... | 365/230.03 |
| 6,392,951 | B2 | * | 5/2002 | Fujima et al. ............. | 365/230.03 |
| 6,538,945 | B2 | * | 3/2003 | Takemura et al. .......... | 365/205 |
| 6,597,621 | B2 | * | 7/2003 | Tsuji et al. ................ | 365/230.03 |
| 6,693,844 | B2 | * | 2/2004 | Morgan et al. ........... | 365/230.03 |
| 6,704,237 | B2 | * | 3/2004 | Park ......................... | 365/230.03 |
| 6,765,842 | B2 | * | 7/2004 | Kim ......................... | 365/230.03 |
| 6,885,606 | B2 | * | 4/2005 | Kumazaki et al. ........ | 365/230.03 |
| 6,928,006 | B2 | * | 8/2005 | Park ......................... | 365/230.03 |
| 7,031,216 | B2 | * | 4/2006 | You .......................... | 365/230.03 |
| 7,054,220 | B2 | * | 5/2006 | Kwean ...................... | 365/230.03 |

(Continued)

FOREIGN PATENT DOCUMENTS

JP    11-162161    6/1999

(Continued)

OTHER PUBLICATIONS

Song, U.S. Patent Application Publication US 2007/02622804 A1 (U.S. Appl. No. 11/643,822).*

(Continued)

*Primary Examiner* — Trong Phan (74) *Attorney, Agent, or Firm* — IP & T Group LLP (57) ABSTRACT

A semiconductor memory device includes a plurality of memory banks each having a plurality of memory cell arrays, a plurality of sense amplification units corresponding to the memory banks, configured to sense data corresponding to a selected memory cell to amplify the sensed data, and a common delay unit configured to delay a plurality of respective bank active signals activated in correspondence with the memory banks by a predetermined time to generate an operation control signal for controlling the sense amplification units.

20 Claims, 10 Drawing Sheets

U.S. PATENT DOCUMENTS

| | | | |
|---|---|---|---|
| 7,068,558 B2 * | 6/2006 | Cho | 365/222 |
| 7,289,385 B2 * | 10/2007 | Kwak | 365/230.03 |
| 7,327,618 B2 * | 2/2008 | Sawhney | 365/194 |
| 7,359,269 B2 * | 4/2008 | You | 365/194 |
| 7,420,867 B2 * | 9/2008 | Brox | 365/230.03 |
| 7,433,261 B2 * | 10/2008 | Freebern et al. | 365/230.03 |
| 7,499,367 B2 * | 3/2009 | Park | 365/230.06 |
| 7,545,687 B2 * | 6/2009 | Lee et al. | 365/194 |
| 7,629,826 B2 * | 12/2009 | Song | 327/291 |
| 7,633,822 B2 * | 12/2009 | Seo | 365/208 |
| 7,675,798 B2 * | 3/2010 | Song | 365/205 |
| 7,733,734 B2 * | 6/2010 | Song | 365/230.03 |
| 7,751,257 B2 * | 7/2010 | Kim | 365/205 |
| 7,751,268 B2 * | 7/2010 | Park | 365/205 |
| 7,751,271 B2 * | 7/2010 | Kim et al. | 365/230.03 |
| 7,768,860 B2 * | 8/2010 | You | 365/230.03 |
| 7,813,200 B2 * | 10/2010 | Seo | 365/205 |
| 7,826,289 B2 * | 11/2010 | Han | 365/230.03 |
| 7,881,140 B2 * | 2/2011 | Yang | 365/230.03 |
| 7,894,295 B2 * | 2/2011 | Kim et al. | 365/230.03 |

FOREIGN PATENT DOCUMENTS

KR   1020020055160   7/2002

OTHER PUBLICATIONS

Notice of Preliminary Rejection issued from Korean Intellectual Property Office on Jul. 30, 2010.

Notice of Allowance issued from Korean Intellectual Property Office on May 31, 2011.

* cited by examiner

SEMICONDUCTOR MEMORY DEVICE

CROSS-REFERENCE TO RELATED APPLICATIONS

The present invention claims priority of Korean patent application number 10-2008-0137384, filed on Dec. 30, 2008, which is incorporated by reference in its entirety.

BACKGROUND OF THE INVENTION

The present invention relates to a semiconductor design technology, and more particularly, to a high-integrated semiconductor memory device including a plurality of memory banks and various internal circuits for performing the input/output operation of data and internal structure thereof.

Generally, a semiconductor memory device including a Double Data Rate Synchronous Dynamic Random Access Memory (DDR SDRAM), for example, stores or outputs data according to a command required by a central processing unit (CPU). In a case where the CPU requires a writing operation, the semiconductor memory device stores data in a memory cell corresponding to address information input from the CPU. In a case where the CPU requires a read operation, the semiconductor memory device outputs the data stored in the memory cell corresponding to the address information input from the CPU.

The semiconductor memory device includes ten millions or more memory cells, and a set of the memory cells generally is called a memory bank. That is, the memory bank includes a plurality of memory cell arrays. The number of memory banks included in the semiconductor memory device may be changed according to design, but the number of the memory banks is increasing recently for the large-scaling of the semiconductor memory device.

Figure 1:
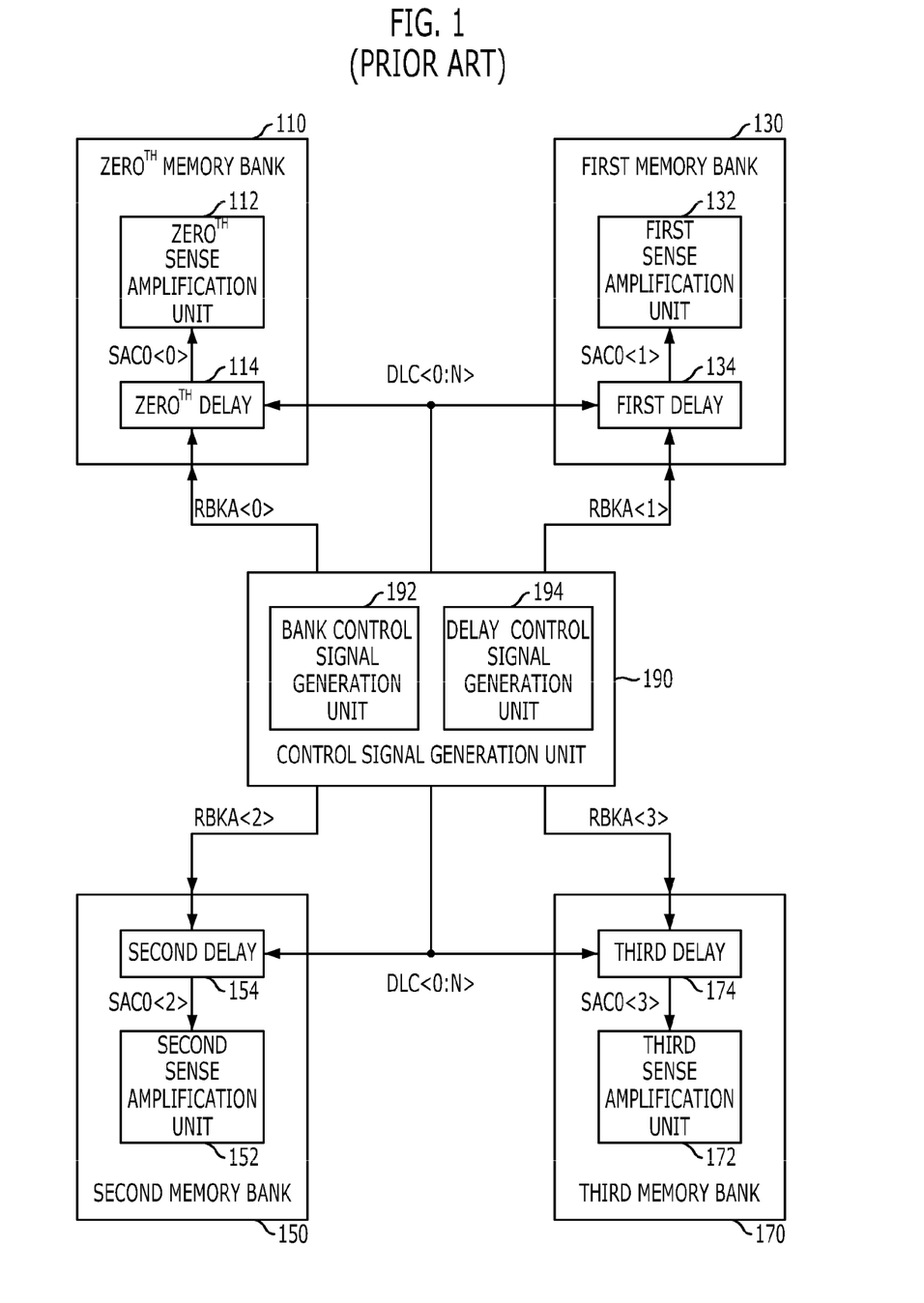
FIG. 1 is a block diagram illustrating some configuration of the existing semiconductor memory device.

FIG. 1 is a block diagram illustrating some configuration of the existing semiconductor memory device, and illustrates a DRAM including four memory banks as an example.

Referring to FIG. 1, the semiconductor memory device includes zero$^{th}$ to third memory banks 110, 130, 150 and 170 disposed in a core region, and a control signal generation unit 190 patched in a peripheral region other than the core region, i.e., a peripheral region.

For convenience, the following description will be made on configuration corresponding to the zero$^{th}$ memory bank 110 as a representative example.

The zero$^{th}$ memory bank 110 is activated in response to a zero$^{th}$ bank active signal RBKA<0>, and includes a plurality of memory cell arrays (not shown) storing data, a zero$^{th}$ sense amplification unit 112 sensing and amplifying data corresponding to a memory cell selected by the zero$^{th}$ bank active signal RBKA<0> among a plurality of memory cells in the zero$^{th}$ memory bank 110, and a zero$^{th}$ delay 114 delaying the zero$^{th}$ bank active signal RBKA<0> by a predetermined time to generate a zero$^{th}$ operation control signal SAC0<0>.

Herein, the zero$^{th}$ bank active signal RBKA<0> is generated in a bank control signal generation unit 192, and is a signal activated upon the active operation of the zero$^{th}$ memory bank 110. The zero$^{th}$ sense amplification unit 112 operates according to the zero$^{th}$ operation control signal SAC0<0> where the zero$^{th}$ bank active signal RBKA<0> has been delayed by the predetermined time. Subsequently, a time delayed by the zero$^{th}$ delay 114 is controlled by delay control signals DLC<0:N> (N is a natural number) generated by a delay control signal generation unit 194.

The first to third memory banks 130, 150 and 170 have configuration similar to that of the zero$^{th}$ memory bank 110.

The first to third memory banks 130, 150 and 170 perform active operations in response to corresponding first to third bank active signals RBKA<1> to RBKA<3>, respectively. First to third delays 134, 154 and 174 receive the first to third bank active signals RBKA<1> to RBKA<3> to delay them by a time corresponding to the delay control signals DLC<0:N>, and generates zero$^{th}$ operation control signals SAC0<1> to SAC0<3> corresponding to respective first to third sense amplification units 132, 152 and 172. Herein, the number of the zero$^{th}$ operation control signals SAC0<0> to SAC0<3> corresponding to the respective zero$^{th}$ to third sense amplification units 112, 132, 152 and 172 may be changed according to the operation of the sense amplification unit.

The control signal generation unit 190 includes a bank control signal generation unit 192 generating the zero$^{th}$ to third bank active signals RBKA<0:3> for selecting any one of the zero$^{th}$ to third memory banks 110, 130, 150 and 170 in response to an external address, and a delay control signal generation unit 194 generating the delay control signals DLC<0:N> for controlling a time delayed by the zero$^{th}$ to third delays 114, 134, 154 and 174 upon a test mode.

Figure 2:
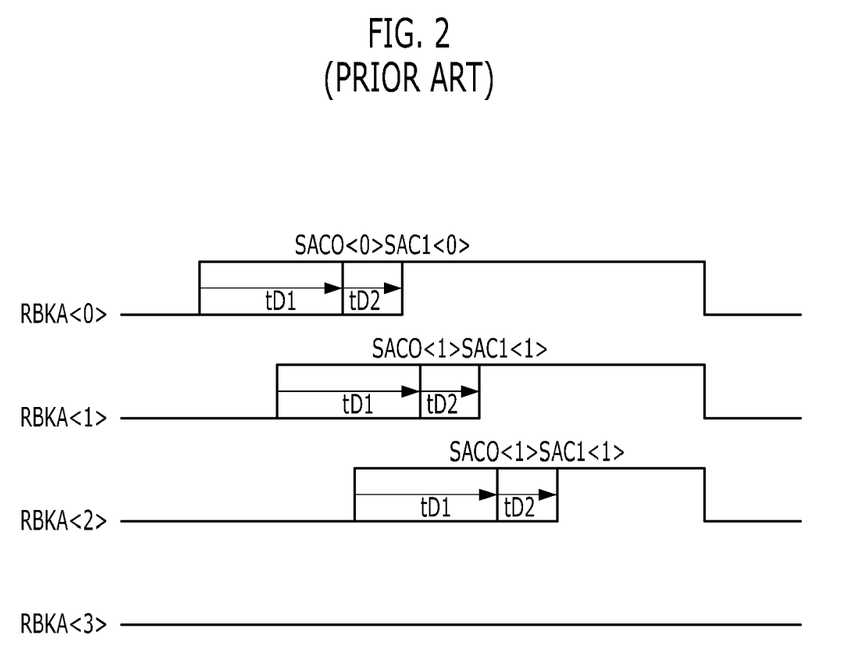
FIG. 2 is a waveform diagram describing the operation waveform of the semiconductor memory device of FIG. 1.

FIG. 2 is a waveform diagram describing the operation waveform of the semiconductor memory device of FIG. 1. It is assumed that the number of operation control signals for controlling the zero$^{th}$ to third sense amplification units 112, 132, 152 and 172 is 2, respectively. In other words, the zero$^{th}$ operation control signal SAC0<0> and a first operation control signal (hereinafter, SAC1<0>) exist in correspondence with the zero$^{th}$ sense amplification unit 112, the zero$^{th}$ operation control signal SAC0<1> and a first operation control signal SAC1<1> exist in correspondence with the first sense amplification unit 132, the zero$^{th}$ operation control signal SAC0<2> and a first operation control signal SAC1<2> exist in correspondence with the second sense amplification unit 152, and the zero$^{th}$ operation control signal SAC0<3> and a first operation control signal SAC1<3> exist in correspondence with the third sense amplification unit 172. The delay control signals DLC<0:N> will not be considered in FIG. 2.

Referring to FIGS. 1 and 2, when a zero$^{th}$ bank active signal RBKA<0> is activated from a logic low level to a logic high level, the zero$^{th}$ delay 114 delays the zero$^{th}$ bank active signal RBKA<0> by tD1 to generate the zero$^{th}$ operation control signal SAC0<0> corresponding to the zero$^{th}$ sense amplification unit 112, and thereafter delays the zero$^{th}$ operation control signal SAC0<0> by tD2 to generate the first operation control signal SAC1<0> corresponding to the zero$^{th}$ sense amplification unit 112. In this way, the generated zero$^{th}$ and first operation control signals SAC0<0> and SAC1<0> control the zero$^{th}$ sense amplification unit 122.

In a case of the DRAM as illustrated in FIG. 1, the zero$^{th}$ to third memory banks 110, 130, 150 and 170 may simultaneously perform an active operation, and the word line (not shown) of a corresponding memory bank is enabled in response to the selected zero$^{th}$ to third bank active signals RBKA<0:3>. When the word line is enabled, the data of a memory cell connected to the word line is transferred to a corresponding sense amplification unit, and the sense amplification unit senses the data to perform an amplification operation. At this point, the sense amplification unit is controlled by the zero$^{th}$ and first operation control signals generated through the delay of a corresponding bank active signal.

Figure 3:
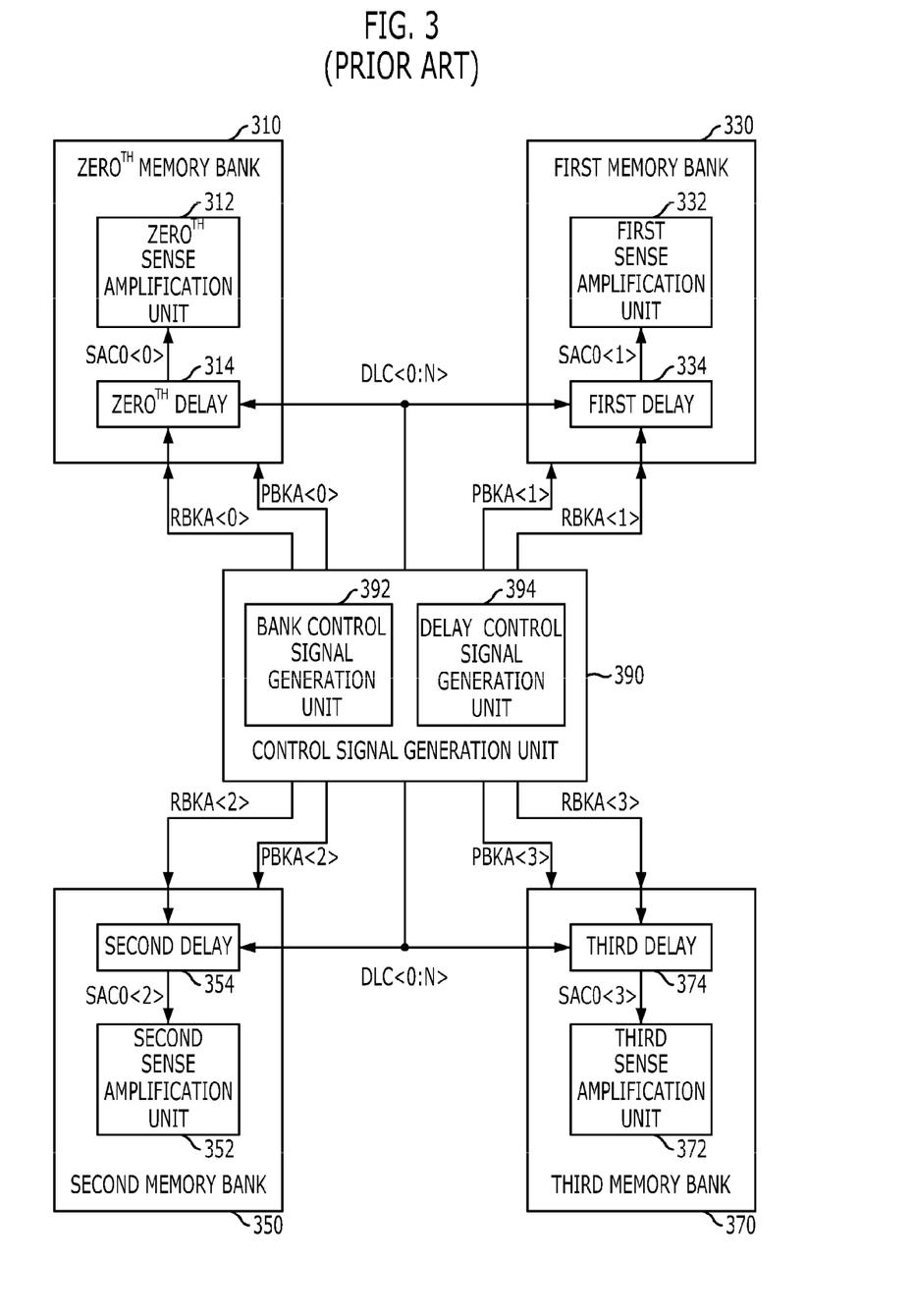
FIG. 3 is a block diagram illustrating some configuration of the existing semiconductor memory device.

FIG. 3 is a block diagram illustrating some configuration of the existing semiconductor memory device, and illustrates a Phase Random Access Memory (PDRAM) including four memory banks as an example.

Referring to FIG. 3, the semiconductor memory device includes zero$^{th}$ to third memory banks 310, 330, 350 and 370 disposed in a core region, and a control signal generation unit 390 patched in a peripheral region.

For the sake of convenience, the following description will be made on configuration corresponding to the zero$^{th}$ memory bank 310 as a representative example.

The zero$^{th}$ memory bank 310 is activated in response to a zero$^{th}$ bank active signal RBKA<0> and a zero$^{th}$ programming active signal PBKA<0>, and includes a plurality of memory cell arrays (not shown) storing data, a zero$^{th}$ sense amplification unit 312 sensing and amplifying data corresponding to a memory cell selected by the zero$^{th}$ bank active signal RBKA<0> among a plurality of memory cells in the zero$^{th}$ memory bank 310, and a zero$^{th}$ delay 314 delaying the zero$^{th}$ bank active signal RBKA<0> by a predetermined time to generate a zero$^{th}$ operation control signal SAC0<0>.

Herein, the zero$^{th}$ bank active signal RBKA<0> and the zero$^{th}$ programming active signal PBKA<0> are generated in a bank control signal generation unit 392. Among these, the zero$^{th}$ bank active signal RBKA<0> is a signal that is activated for activating the zero$^{th}$ memory bank 310 upon a read operation, and the zero$^{th}$ programming active signal PBKA<0> is a signal that is activated for activating the zero$^{th}$ memory bank 310 upon a programming operation.

Hereinafter, the following description will be made on a memory cell used in the PRAM for understanding the programming operation.

Generally, the semiconductor memory device including the PRAM is classified into a nonvolatile memory device standing comparison with a volatile memory device such as the DRAM, and consumes power less than the consumption power of the DRAM. Such a semiconductor memory device includes a phase change material in a memory cell for storing data. A widely known phase change material includes Ge—Sb—Te (GST) being the compound of germanium (Ge), antimony (Sb) and tellurium (Te). The phase change material is changed into two stable states by heating. That is, the phase change material has an amorphous state and a crystalline state.

Herein, the amorphous state is a state where the phase change material is heated for a short time at a temperature near to a melting temperature and thereafter is changed by rapidly cooling. On the contrary, the crystalline state is a state where the phase change material is heated for a long time at a crystallization temperature lower than the melting temperature and thereafter is changed by gradually cooling. The phase change material of the amorphous state has resistivity higher than the phase change material of the crystalline state. The memory cell represents a logic low data and a logic high data by using the properties of the phase change material. In this way, an operation of changing the phase change material into the amorphous state or the crystalline state calls a programming operation. The respective zero$^{th}$ to third memory banks 310, 330, 350 and 370 perform the programming operation in response to zero$^{th}$ to third programming active signals PBKA<0:3> corresponding to them, respectively.

As shown in FIG. 1, the semiconductor memory device of FIG. 3 controls the zero$^{th}$ sense amplification unit 312 according to a zero$^{th}$ operation control signal SAC0<0> where the zero$^{th}$ bank active signal RBKA<0> has been delayed by a predetermined time. Subsequently, the delay time of the zero$^{th}$ delay 314 is controlled by delay control signals DLC<0:N> (N is a natural number) generated by a delay control signal generation unit 394.

The first to third memory banks 330, 350 and 370 have configuration similar to that of the zero$^{th}$ memory bank 310. The first to third memory banks 330, 350 and 370 perform active operations in response to corresponding first to third bank active signals RBKA<1> to RBKA<3> and first to third programming active signals PBKA<1> to PBKA<3>, respectively. Furthermore, first to third delays 334, 354 and 374 receive the first to third bank active signals RBKA<1> to RBKA<3> to delay them by a time corresponding to the delay control signals DLC<0:N>, and generates zero$^{th}$ operation control signals SAC0<1> to SAC0<3> corresponding to respective first to third sense amplification units 332, 352 and 372. Subsequently, the first to third sense amplification units 332, 352 and 372 are controlled according to the zero$^{th}$ operation control signals SAC0<1> to SAC0<3> corresponding to them, respectively. Herein, the number of the zero$^{th}$ operation control signals SAC0<0> to SAC0<3> corresponding to the respective zero$^{th}$ to third sense amplification units 312, 332, 352 and 372 may be changed according to the operation of the sense amplification unit.

The control signal generation unit 390 includes a bank control signal generation unit 392 generating the zero$^{th}$ to third bank active signals RBKA<0:3> for selecting any one of the zero$^{th}$ to third memory banks 310, 330, 350 and 370 and the zero$^{th}$ to third programming active signals PBKA<0:3> for selecting the zero$^{th}$ to third memory banks 310, 330, 350 and 370 to be programmed in response to an external address, and a delay control signal generation unit 394 generating the delay control signals DLC<0:N> for controlling a time delayed by the zero$^{th}$ to third delays 314, 334, 354 and 374 upon a test mode.

As seen in FIGS. 1 and 3, although the PRAM and the DRAM have different configurations of the memory cells, since they have similar operations, configurations designed in relation with the characteristic of said each memory cell are designed differently from each other whereas configurations other than them are designed similarly to each other. Therefore, the design of the DRAM is considered upon the PRAM, or the design of the PRAM is considered upon design of the DRAM.

Figure 4:
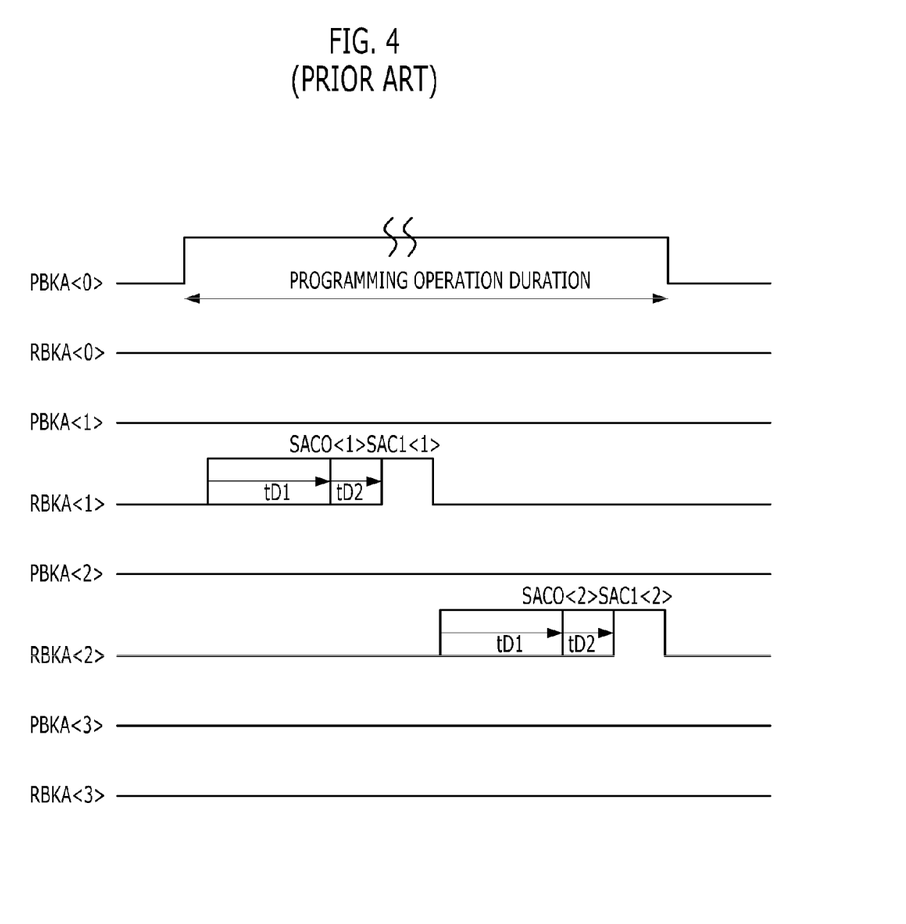
FIG. 4 is a waveform diagram describing the operation waveform of the semiconductor memory device of FIG. 3.

FIG. 4 is a waveform diagram describing the operation waveform of the semiconductor memory device of FIG. 3. It is assumed that the number of operation control signals corresponding to the zero$^{th}$ to third sense amplification units 312, 332, 352 and 372 is 2, respectively. In other words, the zero$^{th}$ operation control signal SAC0<0> and a first operation control signal (hereinafter, SAC1<0>) exist in correspondence with the zero$^{th}$ sense amplification unit 312, the zero$^{th}$ operation control signal SAC0<1> and a first operation control signal SAC1<1> exist in correspondence with the first sense amplification unit 332, the zero$^{th}$ operation control signal SAC0<2> and a first operation control signal SAC1<2> exist in correspondence with the second sense amplification unit 352, and the zero$^{th}$ operation control signal SAC0<3> and a first operation control signal SAC1<3> exist in correspondence with the third sense amplification unit 372. The delay control signals DLC<0:N> will not be considered in FIG. 4. Moreover, for the sake of convenience, the following description will be made on a case where the programming operation is performed in the zero$^{th}$ memory bank 312 and the active operation is performed in each of the first and second memory banks 330 and 350 as an example.

Referring to FIGS. 3 and 4, the zero$^{th}$ programming active signal PBKA<0> is shifted from a logic low level to a logic high level for performing the programming operation in the zero$^{th}$ memory bank 310. In a case of the semiconductor memory device such as the PRAM, in an operation duration where the programming operation is performed in any one of the memory banks, the active operation of other memory bank may be performed. This is because the zero$^{th}$ sense amplification unit 312 does not perform a sense amplification operation in a duration where the programming operation is performed on the zero$^{th}$ memory bank 310. For reference, the programming operation is performed using a separate latch circuit, and the latch circuit has data information to be stored in the memory cell.

When the first bank active signal RBKA<1> is activated to a logic high level in correspondence with the first memory bank 330, the first delay 334 delays the first bank active signal RBKA<1> by tD1 to generate the zero$^{th}$ operation control signal SAC0<1> corresponding to the first sense amplification unit 332, and thereafter delays the zero$^{th}$ operation control signal SAC0<1> by tD2 to generate the first operation control signal SAC1<1> corresponding to the first sense amplification unit 332. In this way, the generated zero$^{th}$ and first operation control signals SAC0<1> and SAC1<1> control the first sense amplification unit 332. Subsequently, the first bank active signal RBKA<1> is deactivated to a logic low level.

When the second bank active signal RBKA<2> corresponding to the second memory bank 350 is activated to a logic high level, the second delay 354 delays the second bank active signal RBKA<2> by tD1 to generate the zero$^{th}$ operation control signal SAC0<2> corresponding to the second sense amplification unit 352, and thereafter delays the zero$^{th}$ operation control signal SAC0<2> by tD2 to generate the first operation control signal SAC1<2> corresponding to the second sense amplification unit 352. In this way, the generated zero$^{th}$ and first operation control signals SAC0<2> and SAC1<2> control the second sense amplification unit 352. Subsequently, the second bank active signal RBKA<2> is deactivated to a logic low level.

In a case of the semiconductor memory device exemplified in FIGS. 3 and 4, any one of the zero$^{th}$ to third memory banks 110, 130, 150 and 170 performs the programming operation, and simultaneously the active operation of other memory bank is performed. At this point, the activation durations of the activated memory banks do not overlap with each other.

The semiconductor memory device is being further highly integrated, and efforts are being continuously made for decreasing a chip area in order to improve productivity. Actually, as the area of the semiconductor memory device decreases, the number of the semiconductor memory devices capable of being produced through one wafer increases, thereby enabling to save the manufacturing cost though the improvement of productivity. Hereinafter, the following description will be made on a semiconductor memory device capable of decreasing a chip area though the present specification.

SUMMARY OF THE INVENTION

Embodiments of the present invention are directed to provide a semiconductor memory device, which can generate an operation control signal for controlling a sense amplification unit through one common delay path upon an active operation.

In accordance with an aspect of the present invention, there is provided a semiconductor memory device, including a plurality of memory banks each having a plurality of memory cell arrays, a plurality of sense amplification units corresponding to the memory banks, configured to sense data corresponding to a selected memory cell to amplify the sensed data, and a common delay unit configured to delay a plurality of respective bank active signals activated in correspondence with the memory banks by a predetermined time to generate an operation control signal for controlling the sense amplification units.

In accordance with another aspect of the present invention, there is provided a semiconductor memory device, including first and second memory banks each having a plurality of memory cell arrays, configured to be activated in response to first and second bank active signals, a common sense amplification unit configured to sense data corresponding to a memory cell selected from the first and second memory banks to amplify the sensed data, and a common delay unit configured to delay the first and second bank active signals activated in correspondence with the first and second memory banks by a predetermined time to generate an operation control signal for controlling the common sense amplification unit.

In accordance with another aspect of the present invention, there is provided a semiconductor memory device, including a plurality of memory banks each having a plurality of memory cell arrays, disposed in a core region a plurality of sense amplification units disposed in the core region, corresponding to the memory banks, configured to sense data corresponding to a selected memory cell to amplify the sensed data, a common delay unit disposed in a peripheral region, configured to delay a plurality of respective bank active signals activated in correspondence with the memory banks by a common delay time to generate a first operation control signal for controlling a first operation point of said each sense amplification unit, and a plurality of individual delay units disposed between the common delay unit and the respective sense amplification units, configured to delay the first operation control signal by an individual delay time to generate a second operation control signal for controlling a second operation point of said each sense amplification unit.

Embodiments of the present invention generate an operation control signal for controlling a sense amplification unit through one common delay path upon an active operation, and thus can replace delays, which are disposed in correspondence with a plurality of sense amplification units in the past respectively, with one common delay. Accordingly, the semiconductor memory device according to embodiments of the present invention can decrease its area by the delay used in common.

DESCRIPTION OF SPECIFIC EMBODIMENTS

Other objects and advantages of the present invention can be understood by the following description, and become apparent with reference to the embodiments of the present invention.

Figure 5:
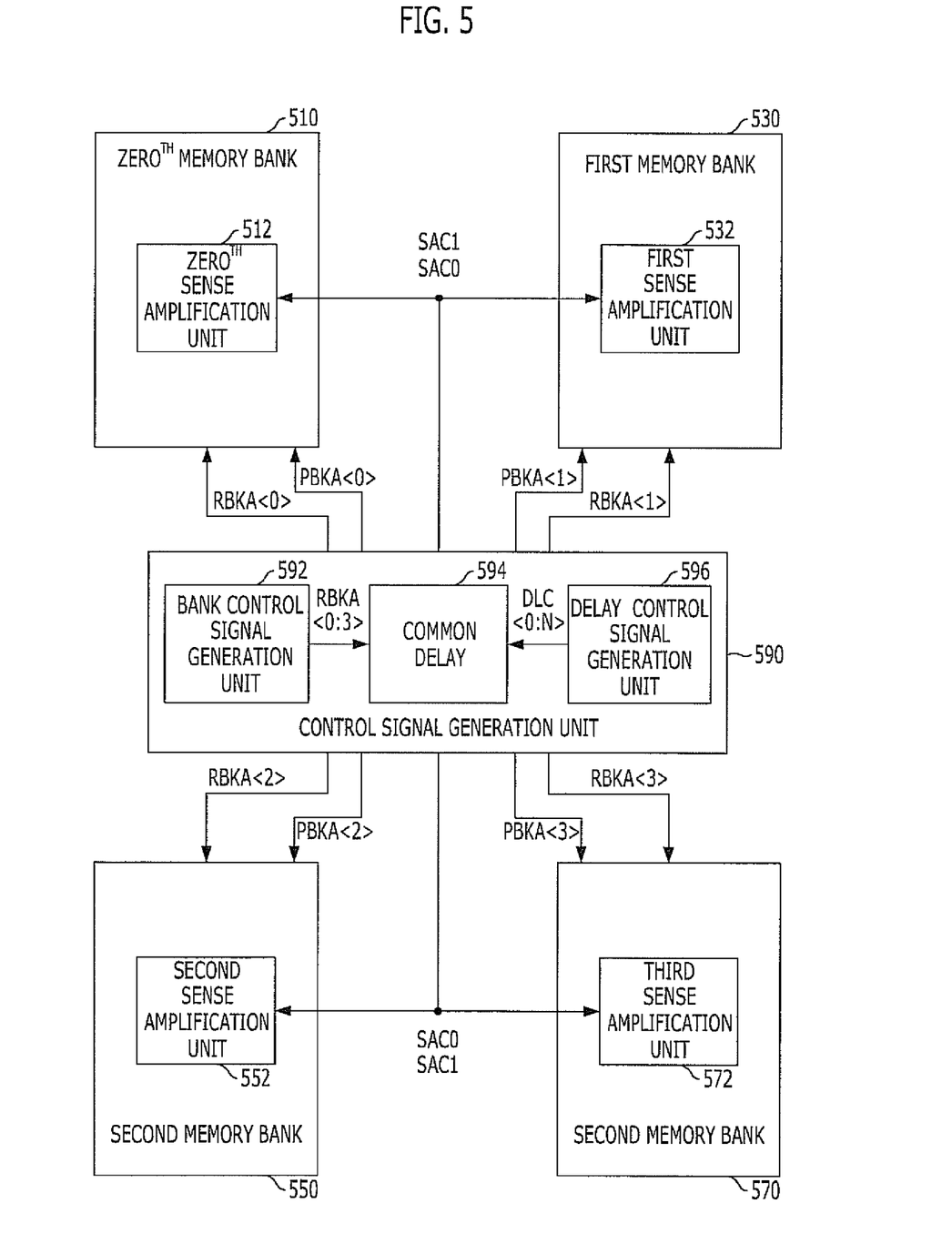
FIG. 5 is a block diagram illustrating some configuration of a semiconductor memory device in accordance with an embodiment of the present invention.

FIG. 5 is a block diagram illustrating some configuration of a semiconductor memory device in accordance with an embodiment of the present invention, and illustrates a PRAM including four memory banks as an example.

Referring to FIG. 5, the semiconductor memory device may include zero$^{th}$ to third memory banks 510, 530, 550 and 570 disposed in a core region, and a control signal generation unit 590 patched in a peripheral region.

For the sake of convenience, the following description will be made on configuration corresponding to the zero$^{th}$ memory bank 510 as a representative example.

The zero$^{th}$ memory bank 510 is activated in response to a zero$^{th}$ bank active signal RBKA<0> and a zero$^{th}$ programming active signal PBKA<0>, and includes a plurality of memory cell arrays (not shown) storing data, and a zero$^{th}$ sense amplification unit 512 sensing and amplifying data corresponding to a memory cell selected by the zero$^{th}$ bank active signal RBKA<0> among a plurality of memory cells in the zero$^{th}$ memory bank 510. Herein, the sense amplification unit 512 may be controlled by a zero$^{th}$ operation control signal SAC0.

Herein, the zero$^{th}$ bank active signal RBKA<0> and the zero$^{th}$ programming active signal PBKA<0> may be generated in a bank control signal generation unit 592. Among these, the zero$^{th}$ bank active signal RBKA<0> is a signal that is activated upon the active operation of the zero$^{th}$ memory bank 510, and the zero$^{th}$ programming active signal PBKA<0> is a signal that is activated upon the programming operation of the zero$^{th}$ memory bank 510.

The semiconductor memory device in accordance with an embodiment of the present invention may control the zero$^{th}$ sense amplification unit 512 according to the zero$^{th}$ operation control signal SAC0 where the zero$^{th}$ bank active signal RBKA<0> has been delayed by a predetermined time though a common delay 594. Hereinafter, relevant description will be again made. The zero$^{th}$ operation control signal SAC0 of the common delay 594 is activated in response to respective first to third bank active signals RBKA<1:3>, like the zero$^{th}$ bank active signal RBKA<0>. The zero$^{th}$ operation control signal SAC0 may control a sense amplification unit corresponding to the first to third bank active signals RBKA<1:3> among first to third sense amplification units 532, 552 and 572. Subsequently, the delay time of the common delay 594 may be controlled by delay control signals DLC<0:N> (N is a natural number) generated by a delay control signal generation unit 596.

The first to third memory banks 530, 550 and 570 have configuration similar to that of the zero$^{th}$ memory bank 510. The first to third memory banks 530, 550 and 570 may perform active operations in response to the corresponding first to third bank active signals RBKA<1> to RBKA<3> respectively, and may perform programming operations in response to corresponding first to third programming active signals PBKA<1> to PBKA<3> respectively. Furthermore, the first to third sense amplification units 532, 552 and 572 are controlled according to the zero$^{th}$ operation control signal SAC0 output from the common delay 594. Herein, the number of the zero$^{th}$ operation control signal SAC0 for controlling the zero$^{th}$ to third sense amplification units 512, 532, 552 and 572 may be changed according to the operation of the sense amplification unit.

The control signal generation unit 590 may include a bank control signal generation unit 592 generating the zero$^{th}$ to third bank active signals RBKA<0:3> for selecting any one of the zero$^{th}$ to third memory banks 510, 530, 550 and 570 and the zero$^{th}$ to third programming active signals PBKA<0:3> for selecting the zero$^{th}$ to third memory banks 510, 530, 550 and 570 to be programmed in response to an external address, a common delay 594 delaying the zero$^{th}$ to third bank active signals RBKA<0:3> through a common delay path by a predetermined time to generate the zero$^{th}$ operation control signal SAC0, and a delay control signal generation unit 596 generating the delay control signals DLC<0:N> for controlling a time delayed by the common delay 594 upon a test mode. Herein, the delay control signal generation unit 596 may be variously designed to variously control a predetermined time reflected in the common delay 594, and a positioning region may also be changed according to design.

Figure 6:
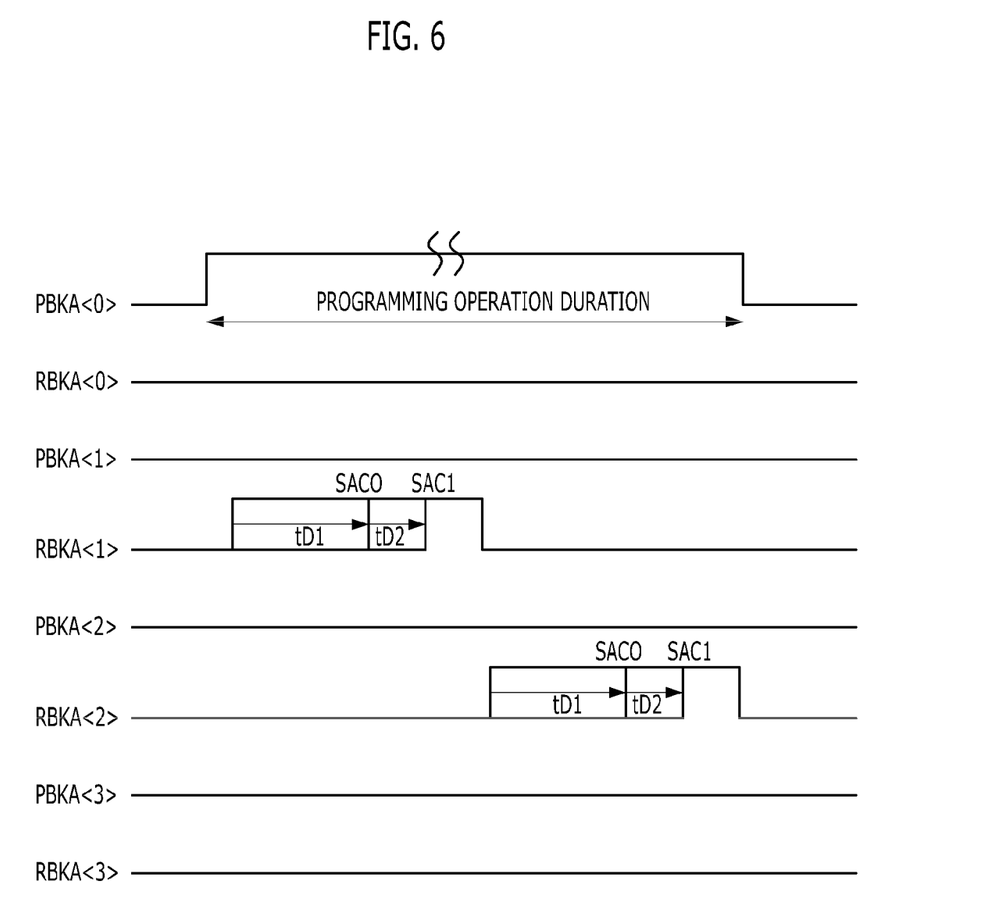
FIG. 6 is a waveform diagram describing the operation waveform of the semiconductor memory device of FIG. 5.

FIG. 6 is a waveform diagram for describing the operation waveform of the semiconductor memory device of FIG. 5. It is assumed that the number of operation control signals for controlling the zero$^{th}$ to third sense amplification units 512, 532, 552 and 572 is 2, respectively. In other words, the zero$^{th}$ operation control signal SAC0 and a first operation control signal (hereinafter, SAC1) exist in correspondence with the zero$^{th}$ to third sense amplification units 512, 532, 552 and 572. Moreover, for convenience, the following description will be made on a case where the programming operation is performed in the zero$^{th}$ memory bank 512 and the active operation is performed in each of the first and second memory banks 530 and 550 as an example. The delay control signals DLC<0:N> will not be considered in FIG. 2.

Referring to FIGS. 5 and 6, the zero$^{th}$ programming active signal PBKA<0> is shifted from a logic low level to a logic high level for performing the programming operation in the zero$^{th}$ memory bank 510. Since the zero$^{th}$ sense amplification unit 512 does not perform a sense amplification operation in a duration where the programming operation is performed on the zero$^{th}$ memory bank 510, an active operation may be performed on other memory bank.

When the first bank active signal RBKA<1> is activated to a logic high level in correspondence with the first memory bank 530, the common delay 594 may delay the first bank active signal RBKA<1> by tD1 to generate the zero$^{th}$ operation control signal SAC0, and thereafter may delay the zero$^{th}$ operation control signal SAC0 by tD2 to generate the first operation control signal SAC1. In this way, the generated zero$^{th}$ and first operation control signals SAC0 and SAC1 may control the first sense amplification unit 532. Subsequently, the first bank active signal RBKA<1> is deactivated to a logic low level. At this point, the first programming active signals PBKA<1> is maintained at a logic low level.

Subsequently, when the second bank active signal RBKA<2> corresponding to the second memory bank 550 is activated to a logic high level, the common delay 594 may delay the second bank active signal RBKA<2> by tD1 to generate the zero$^{th}$ operation control signal SAC0, and thereafter may delay the zero$^{th}$ operation control signal SAC0 by tD2 to generate the first operation control signal SAC1. Like the first sense amplification unit 532, the second sense amplification unit 552 may be controlled by the generated zero$^{th}$ and first operation control signals SAC0 and SAC1. Subsequently, the second bank active signal RBKA<2> is deactivated to a logic low level. At this point, the second programming active signals PBKA<2> is maintained at a logic low level.

Herein, the zero$^{th}$ and first operation control signals SAC0 and SAC1 control the zero$^{th}$ to third sense amplification units 512, 532, 552 and 572. For example, the zero$^{th}$ operation control signal SAC0 may control the start (activation) point of an over-driving operation of the sense amplification unit, and the first operation control signal SAC1 may control the end (deactivation) point of the over-driving operation. Alternatively, the zero$^{th}$ operation control signal SAC0 may control the start (activation) point of the over-driving operation, and the first operation control signal SAC1 may control the start (activation) point of a normal-driving operation.

In a case of the semiconductor memory device exemplified in FIGS. 5 and 6, any one of the zero$^{th}$ to third memory banks 510, 530, 550 and 570 performs the programming operation, and simultaneously the active operation of other memory bank is performed. At this point, since the activation durations of the activated memory banks do not overlap with each other, the zero$^{th}$ and first operation control signals SAC0 and SAC1 for controlling the zero$^{th}$ to third sense amplification units 512, 532, 552 and 572 may be generated through the one common delay 594. That is, the common delay 594 delays the respective zero$^{th}$ to third programming active signals PBKA<0:3> through the one common delay path to generate the zero$^{th}$ and first operation control signals SAC0 and SAC1, and a corresponding sense amplification unit corresponding to the respective zero$^{th}$ to third programming active signals PBKA<0:3> may be controlled using the zero$^{th}$ and first operation control signals SAC0 and SAC1.

In a case of the existing semiconductor memory device (see FIG. 3), respective delays are included in correspondence with a plurality of sense amplification units, and a corresponding sense amplification unit is controlled by an operation control signal output from the delay. However, in a case of the semiconductor memory device in accordance with an embodiment of the present invention (see FIG. 5), the one common delay 594 may be included corresponding to a plurality of sense amplification units, and all the sense amplification units may be controlled by an operation control signal output from the common delay 594. As a result, the semiconductor memory device in accordance with an embodiment of the present invention may minimize the number of delay circuits for generating the operation control signal. The minimization of the delay circuit means that the chip area of the semiconductor memory device can be decreased.

Figure 7A:
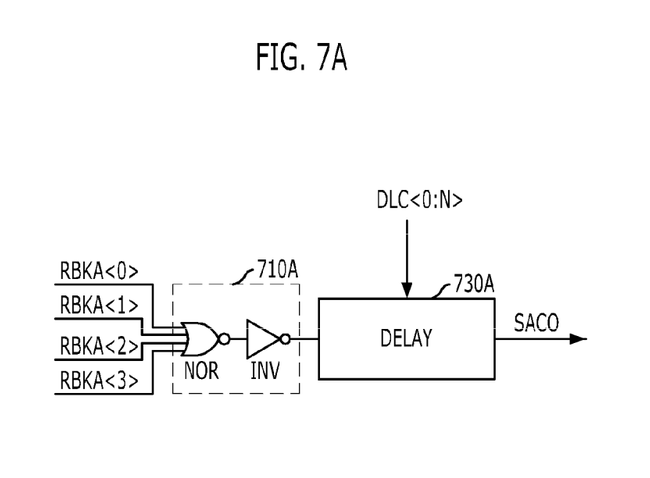
FIGS. 7A and 7B are circuit diagrams illustrating the common delay of FIG. 5.
Figure 7B:
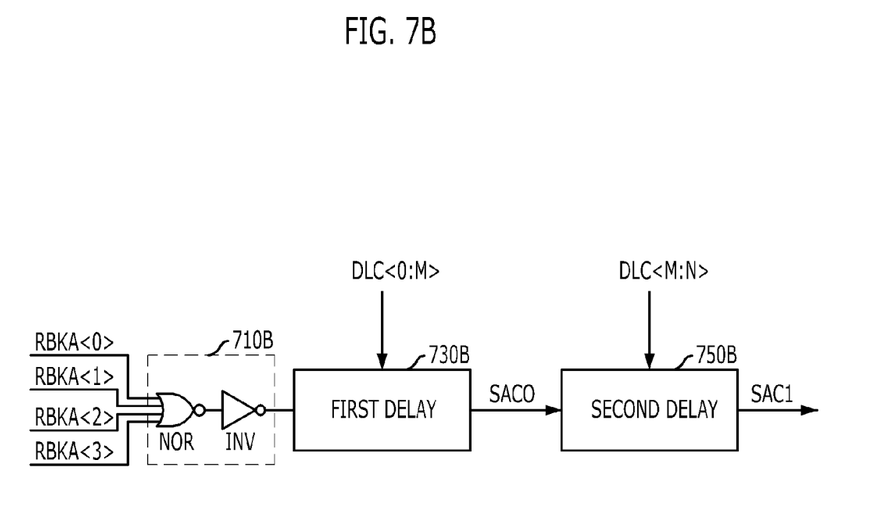

FIGS. 7A and 7B are circuit diagrams illustrating the common delay 594 of FIG. 5.

FIG. 7A illustrates a case of generating one operation control signal, i.e., the zero$^{th}$ operation control signal SAC0 as an example. In this case, the common delay 594 may include a common input unit 710A and a delay 730A.

The common input unit 710A is for receiving the zero$^{th}$ to third bank active signals RBKA<0:3> in common, and may include a NOR gate NOR and an inverter INV. The delay 730A may delay the output signal of the common input unit 710A by a time corresponding to the delay control signals DLC<0:N> to output the zero$^{th}$ operation control signal SAC0. Therefore, when any one of the zero$^{th}$ to third bank active signal RBKA<0:3> is shifted to a logic high level, the common delay 594 may delay the shifted signal by a time reflected in the delay 730A to output it as the zero$^{th}$ operation control signal SAC0.

FIG. 7B illustrates a case of generating two operation control signals, i.e., the zero$^{th}$ and first operation control signals SAC0 and SAC1 as an example. In this case, the common delay 594 may include a common input unit 710B, a first delay 730B, and a second delay 750B.

The common input unit 710B may be configured identically to the common input unit 710A of FIG. 7A to perform the same operation as that of the common input unit 710A. The first delay 730B may delay the output signal of the common input unit 710B by a time corresponding to first delay control signals DLC<0:M> (M is a natural number less than N) to output the zero$^{th}$ operation control signal SAC0. The second delay 750B may delay the output signal of the first delay 730B by a time corresponding to second delay control signals DLC<M:N> to output the first operation control signal SAC1.

Referring again to FIG. 5, the common delay 594 may output the zero$^{th}$ operation control signal SAC0 according to an activated bank active signal among the zero$^{th}$ to third bank active signals RBKA<0:3>, wherein the common delay 594 may output the zero$^{th}$ operation control signal SAC0 corresponding to the activated bank active signal. Furthermore, the activated zero$^{th}$ operation control signal SAC0 may be applied to a sense amplification unit corresponding to the activated bank active signal. That is, the output terminal of the common delay 594 or the input terminal of a corresponding sense amplification unit may include a circuit for transferring the zero$^{th}$ operation control signal SAC0 to the corresponding sense amplification unit in response to the activated bank active signal.

Figure 8A:
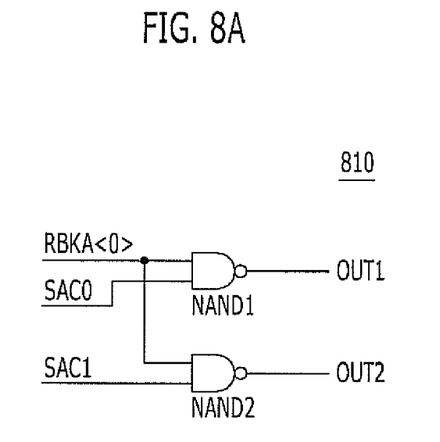
FIGS. 8A to 8C are circuit diagrams illustrating a transfer unit for transferring the operation control signal of FIG. 5.
Figure 8B:
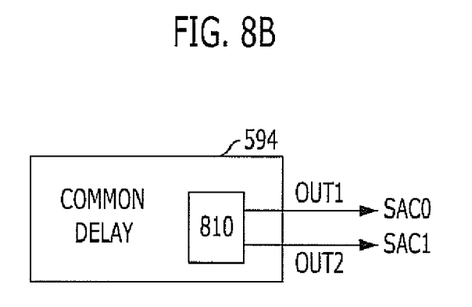
Figure 8C:
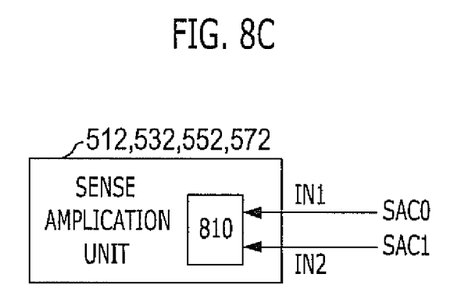

FIGS. 8A to 8C are circuit diagrams illustrating a transfer unit 810 for transferring the operation control signal of FIG. 5, and illustrates a case of transferring the operation control signal output from FIG. 7B as an example. That is, as illustrated in FIG. 7B, the common delay outputs the zero$^{th}$ and first operation control signals SAC0 and SAC. In FIG. 8A for the sake of convenience, the following description will be made on configuration corresponding to the zero$^{th}$ bank active signal RBKA<0> among the zero$^{th}$ to third bank active signals RBKA<0:3> as a representative example.

Referring to FIG. 8A the transfer unit 810 is for respectively outputting the zero$^{th}$ and first operation control signals SAC0 and SAC1 to first and second output terminals OUT1 and OUT2 in response to the zero$^{th}$ bank active signal RBKA<0>, and may include first and second NAND gates NAND1 and NAND2. Therefore, when the zero$^{th}$ bank active signal RBKA<0> is activated to a logic high level, the zero$^{th}$ operation control signal SAC0 may be output to the first output terminal OUT1, and the first operation control signal SAC1 may be output to the second output terminal OUT2.

Herein, as described above and as can be seen from FIG. 8B, the transfer unit 810 may be disposed in the output terminals OUT1 and OUT2 of the common delay 594 of FIG. 5. Alternatively, as can be seen from FIG. 8C, the transfer unit 810 may be disposed in the input terminals IN1 and IN2 of the zero$^{th}$ to third sense amplification units 512, 532, 552 and 572. Hereinafter, the positioning relationship of the transfer unit 810 will be described with again reference to FIG. 5.

First, when the transfer unit 810 is disposed in the output terminal of the common delay 594, the output signal of the transfer unit 810 is in a state where information of an activated bank active signal is reflected. Accordingly, two global lines to which the zero$^{th}$ operation control signal SAC0 and the first operation control signal SAC1 (not shown) are transferred may be designed between the common delay 594 and each of the zero$^{th}$ to third sense amplification units 512, 532, 552 and 572.

Subsequently, when the transfer unit 810 is disposed in the input terminals of the zero$^{th}$ to third sense amplification units 512, 532, 552 and 572, one configuration such as that shown in FIGS. 8A to 8C may be disposed in each of the input terminals of the zero$^{th}$ to third sense amplification units 512, 532, 552 and 572. In this case, two global lines for transferring the zero$^{th}$ and first operation control signals SAC0 and SAC1 may be designed between the common delay 594 and each of the zero[th] to third sense amplification units 512, 532, 552 and 572.

The positioning of the above-described transfer unit 810 may be selectively designed according to a loading relationship reflected in the global line and the number of the global lines.

Figure 9:
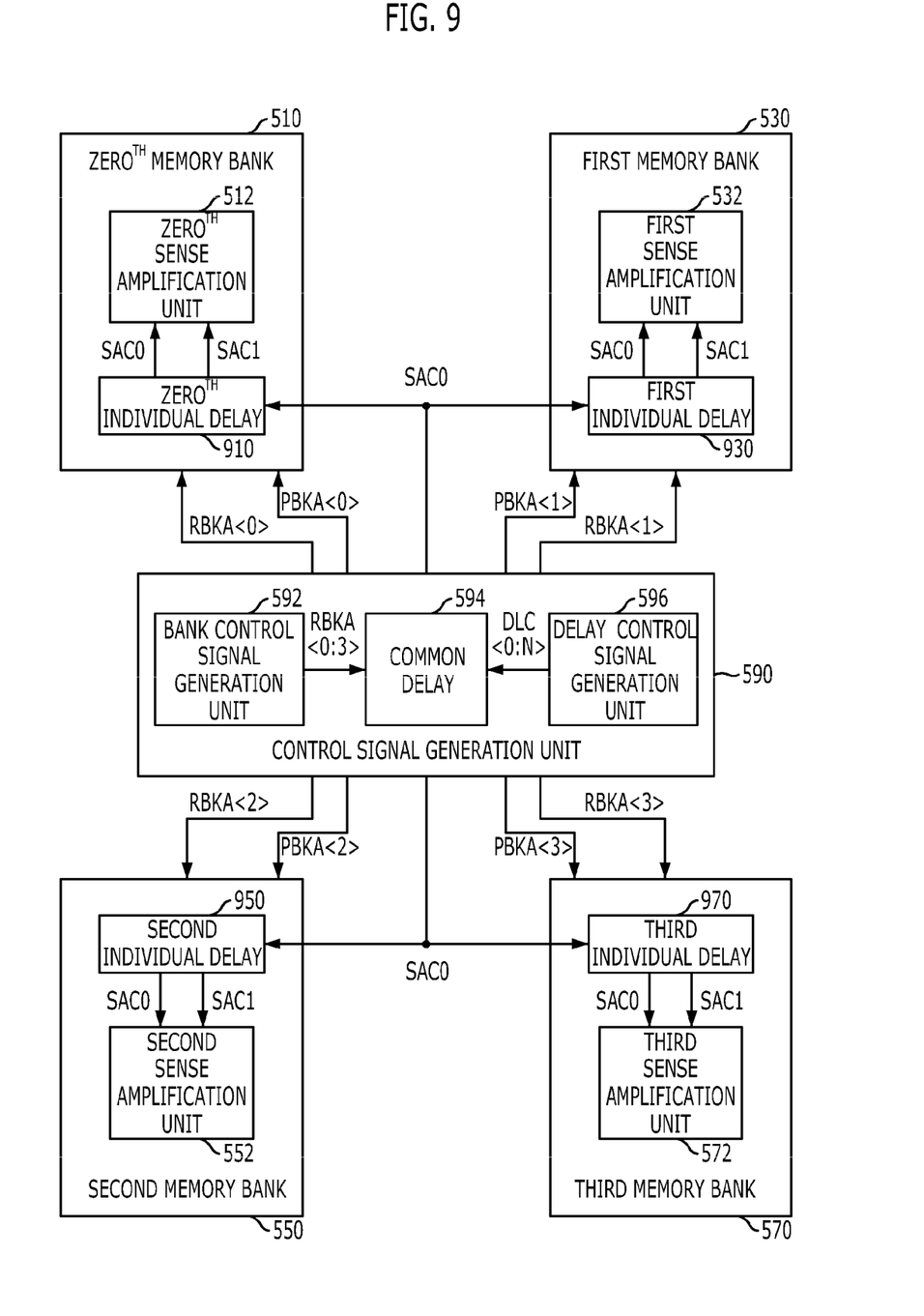
FIG. 9 is a block diagram illustrating some configuration of a semiconductor memory device in accordance with another embodiment of the present invention.

In a case where the semiconductor memory device in accordance with an embodiment of the present invention has the configuration of FIG. 7B, the semiconductor memory device may have configuration such as FIG. 9. FIG. 9 is a block diagram illustrating some configuration of a semiconductor memory device in accordance with another embodiment of the present invention. For convenience, the same elements as those of FIG. 5 refer to like reference numerals, respectively. The following description will be made with reference to FIG. 9 on the common delay 594 and zero[th] to third individual delays 910, 930, 950 and 970.

Referring to FIGS. 7B and 9, the common delay 594 may delay an activated bank active signal among the zero[th] to third bank active signals RBKA<0:3> by a common time to generate the zero[th] operation control signal SAC0, and the zero[th] to third individual delays 910, 930, 950 and 970 may delay the zero[th] operation control signal SAC0 by an individual time to generate the first operation control signal SAC1. Herein, the common delay 594 may be the common input unit 710B and first delay 730B of FIG. 7B, and the zero[th] to third individual delays 910, 930, 950 and 970 may be the second delay 750B. Herein, the zero[th] and first operation control signals SAC0 and SAC1 control the zero[th] to third sense amplification units 512, 532, 552 and 572. For example, the zero[th] operation control signal SAC0 may control the start point of an over-driving operation of the sense amplification unit, and the first operation control signal SAC1 may control the end point of the over-driving operation of the sense amplification unit. Alternatively, the zero[th] operation control signal SAC0 may control the start point of the over-driving operation of the sense amplification unit, and the first operation control signal SAC1 may control the start point of a normal-driving operation of the sense amplification unit.

As described in FIGS. 8A to 8C, in a case where the common delay 594 is configured like FIG. 7B to generate the zero[th] and first operation control signals SAC0 and SAC1, the common delay 594 may transfer the zero[th] and first operation control signals SAC0 and SAC1 through two global lines. In configuration such as FIG. 9, the common delay 549, however, may output only the zero[th] operation control signal SAC0. That is, the semiconductor memory device in accordance with another embodiment of the present invention may design one global line for transferring the zero[th] operation control signal SAC0 to the zero[th] to third individual delays 910, 930, 950 and 970.

A time for generating the zero[th] operation control signal SAC0 may be reflected in the first delay 730B (see FIG. 7) of the common delay 594 of FIG. 9, and a time for generating the first operation control signal SAC1 like the second delay 750B (see FIG. 7) may be reflected in each of the zero[th] to third individual delays 910, 930, 950 and 970. Herein, a time, which is delayed in common in generating the zero[th] and first operation control signals SAC0 and SAC1 as well as a plurality of operation control signals, may be reflected in the first delay 730B in accordance with another embodiment of the present invention. In FIG. 9, although a case where the zero[th] to third individual delays 910, 930, 950 and 970 are disposed in a core region has been described as an example, the respective zero[th] to third individual delays 910, 930, 950 and 970 may be disposed between the common delay 594 and a corresponding sense amplification unit.

Figure 10:
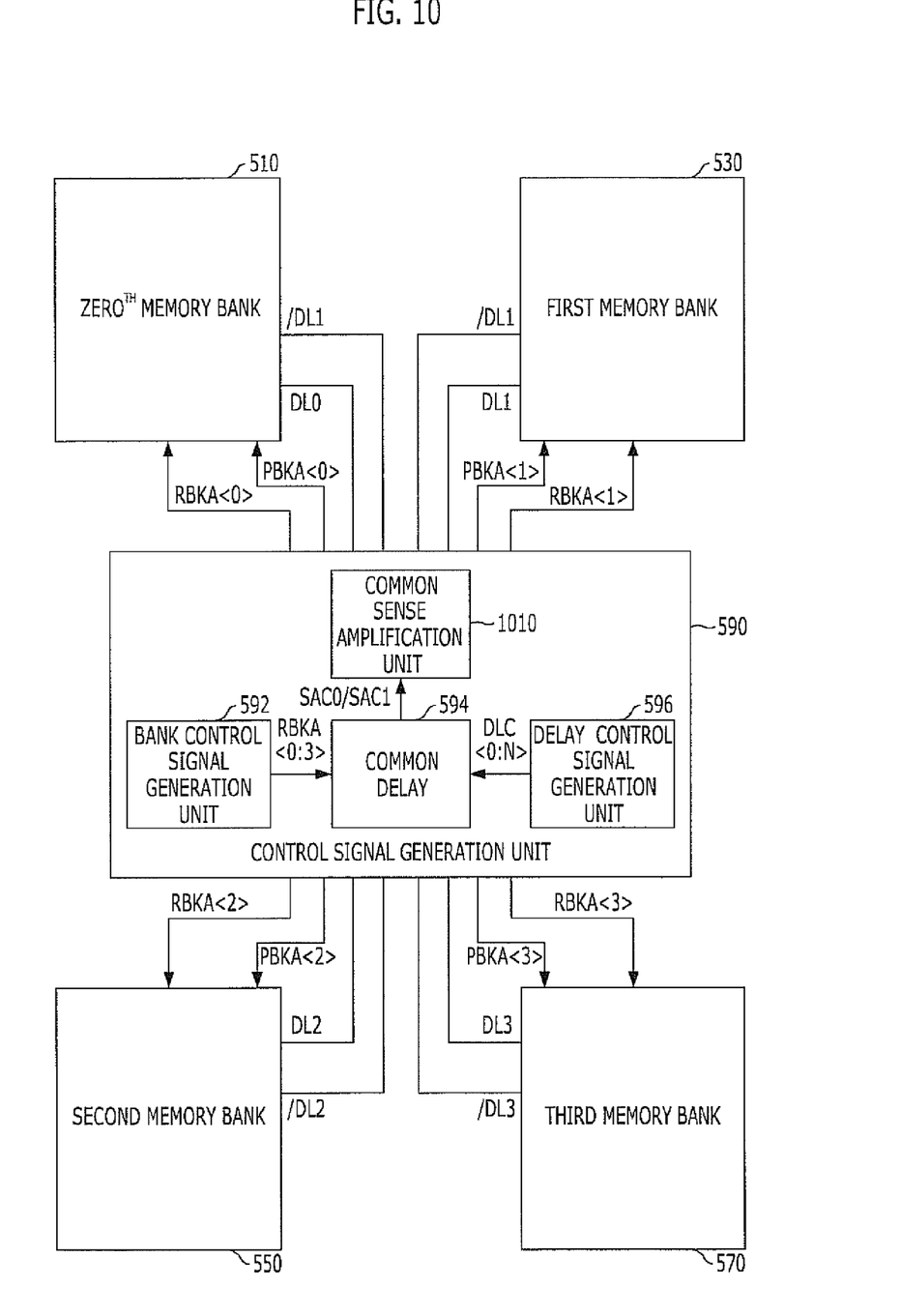
FIG. 10 is a block diagram illustrating some configuration of a semiconductor memory device in accordance with another embodiment of the present invention.

FIG. 10 is a block diagram illustrating some configuration of a semiconductor memory device in accordance with another embodiment of the present invention. For convenience, the same elements as those of FIG. 5 refer to like reference numerals, respectively. The following description will be made with reference to FIG. 10 on the common sense amplification unit 1010.

Referring to FIG. 10, the common sense amplification unit 1010 may sense the data of a memory cell (not shown) selected from the zero[th] to third memory banks 510, 530, 550 and 570 to amplify the sensed data. Herein, the data of a memory cell included in the zero[th] memory bank 510 may be transferred to the common sense amplification unit 1010 though a zero[th] data line pair DL0 and /DL0, the data of a memory cell included in the first memory bank 530 may be transferred to the common sense amplification unit 1010 though a first data line pair DL1 and /DL1, the data of a memory cell included in the second memory bank 550 may be transferred to the common sense amplification unit 1010 though a second data line pair DL2 and /DL2, and the data of a memory cell included in the third memory bank 570 may be transferred to the common sense amplification unit 1010 though a third data line pair DL3 and /DL3. The common sense amplification unit 1010 may sense data transferred through the respective data line pairs to amplify the sensed data.

As seen in FIG. 9, the common sense amplification unit 1010 is not disposed in the zero[th] to third memory banks 510, 530, 550 and 570 being the core region, and may be disposed in the control signal generation unit 590 being a peripheral region. That is, the one common sense amplification unit 1010 may be configured corresponding to the zero[th] to third memory banks 510, 530, 550 and 570. As described in FIG. 6, the reason that the semiconductor memory device in accordance with another embodiment of the present invention can configure the one common sense amplification unit 1010 like FIG. 10 may be because the active operation duration of other memory bank does not overlap in any one programming operation duration among the zero[th] to third memory banks 510, 530, 550 and 570. Referring to FIGS. 7B and 10. The common delay 594 may delay an activated bank active signal among the zero[th] to third bank active signals RBKA<0:3> by a common time to generate the zero[th] operation control signal SAC0, and may delay the zero[th] operation control signal SAC0 by an individual time to generate the first operation control signal SAC1. Herein, the zero[th] and first operation control signals SAC0 and SAC1 control the common sense amplification unit 1010. For example, the zero[th] operation control signal SAC0 may control the start point of an over-driving operation of the sense amplification unit 1010, and the first operation control signal SAC1 may control the end point of the over-driving operation of the sense amplification unit 1010. Alternatively, the zero[th] operation control signal SAC0 may control the start point of the over-driving operation of the sense amplification unit 1010, and the first operation control signal SAC1 may control the start point of a normal-driving operation of the sense amplification unit 1010.

As described above, the semiconductor memory devices in accordance with embodiments of the present invention can generate the operation control signal for controlling the sense amplification unit through the one common delay path upon the active operation. That is, delays that were respectively disposed corresponding to a plurality of sense amplification units in the past may be replaced with the one common delay. Accordingly, the semiconductor memory devices in accordance with embodiments of the present invention can decrease the area according to the delay used in common. The semiconductor memory devices in accordance with embodiments of the present invention can include the one common sense amplification unit to perform the active operation. That is, the semiconductor memory devices in accordance with embodiments of the present invention can replace a plurality of sense amplification units, which were respectively disposed corresponding to a plurality of memory banks in the past, with the one common sense amplification unit. Accordingly, the semiconductor memory devices in accordance with embodiments of the present invention can decrease the area according to the common sense amplification unit used in common. Moreover, the semiconductor memory devices in accordance with embodiments of the present invention can minimize the number of the global lines for transferring the operation control signal, thereby decreasing the area. As a result, embodiments of the present invention can decrease the area of the semiconductor memory device even while performing the same operation as the existing operation, and consequently can ensure the productivity improving and effective-cost of the semiconductor memory device.

Embodiments of the present invention use the delay in common for delaying the control signal used upon the active operation, thereby minimizing the area that the delay circuit occupies. Accordingly, embodiments of the present invention can decrease the chip size of the semiconductor memory device.

Embodiments of the present invention use the delay in common used upon the active operation, thereby minimizing the area that the sense amplification unit occupies in the semiconductor memory device.

Embodiments of the present invention efficiently dispose the delay used upon the active operation, thereby minimizing the number of the global lines to which the control signal is transferred.

While the present invention has been described with respect to the specific embodiments, it will be apparent to those skilled in the art that various changes and modifications may be made without departing from the spirit and scope of the invention as defined in the following claims.

Moreover, in the above-described embodiments, the PRAM has been described as an example, but embodiments of the present invention can be applied to semiconductor memory devices having the different active durations of a plurality of memory banks. Moreover, the above-described embodiments has exemplified the operation control signal for controlling the sense amplification unit as an example, but embodiments of the present invention can apply a control signal which they delay an active signal by a predetermined time to generate.

In addition, in the above-described embodiments, the disposition and kind of the exemplified logic gates and transistors must be differently implemented according to the polarity of an input signal.

What is claimed is:

1. A semiconductor memory device, comprising:
   a plurality of memory banks that each comprise a plurality of memory cell arrays;
   a plurality of sense amplification units corresponding to the memory banks and configured to sense data corresponding to a selected memory cell and amplify the sensed data; and
   a common delay unit commonly coupled to the memory banks and configured to receive a plurality of bank active signals, delay a selected one of the plurality of bank active signals by a predetermined time using a common delay path, and generate the delayed bank active signal as an operation control signal for controlling one of the sense amplification units, wherein each of the plurality of bank active signals activates a corresponding one of the memory banks,
   wherein the common delay unit comprises:
      a common input unit configured to receive the bank active signals; and
      a delay configured to delay an output signal of the common input unit by the predetermined time to output a delayed signal as the operation control signal, wherein an output node of the delay is coupled to inputs of all of the sense amplification units to supply the operation control signal.

2. The semiconductor memory device of claim 1, wherein the common delay unit comprises a transfer unit configured to transfer the delayed signal to a corresponding one of the sense amplification units as the operation control signal in response to the bank active signals.

3. The semiconductor memory device of claim 1, further comprising a delay control unit configured to generate a delay control signal for controlling the predetermined time of the common delay unit.

4. The semiconductor memory device of claim 1, wherein the memory banks and the sense amplification units are disposed in a core region, and the common delay unit is disposed in a peripheral region.

5. The semiconductor memory device of claim 1, wherein the operation control signal comprises a first operation control signal for controlling a first operation point of a respective one of the sense amplification units, and a second operation control signal for controlling a second operation point of the sense amplification unit.

6. The semiconductor memory device of claim 5, wherein the first operation control signal indicates a start point of an over-driving operation of the respective sense amplification unit, and the second operation control signal indicates an end point of the over-driving operation.

7. The semiconductor memory device of claim 5 wherein the first operation control signal indicates a start point of an over-driving operation of the respective sense amplification unit, and the second operation control signal indicates a start point of a normal-driving operation of the respective sense amplification unit.

8. A semiconductor memory device, comprising:
   first and second memory banks that each comprise a plurality of memory cell arrays and are each configured to be activated in response to first and second bank active signals;
   a common sense amplification unit commonly coupled to the memory banks and configured to sense data corresponding to a memory cell selected from the first and second memory banks and amplify the sensed data; and
   a common delay unit commonly coupled to the memory banks and configured to receive the first and second bank active signals, delay a selected one of the first and second bank active signals by a predetermined time using a common delay path, and generate the delayed bank active signal as an operation control signal for controlling the common sense amplification unit,
   wherein the common delay unit comprises:
      a common input unit configured to receive the first and second bank active signals; and
      a delay configured to delay an output signal of the common input unit by the predetermined time to output the operation control signal wherein an output node of the delay is coupled to an input of the common sense amplification unit to supply the operation control signal.

9. The semiconductor memory device of claim 8, further comprising a delay control unit configured to generate a delay control signal for controlling the predetermined time of the common delay unit.

10. The semiconductor memory device of claim 8, wherein the first and second memory banks are disposed in a core region, and the common sense amplification unit and the common delay unit are disposed in a peripheral region.

11. The semiconductor memory device of claim 8, wherein the operation control signal comprises a first operation control signal for controlling a first operation point of the common sense amplification unit, and a second operation control signal for controlling a second operation point of the common sense amplification unit.

12. The semiconductor memory device of claim 11, wherein the first operation control signal indicates a start point of an over-driving operation of the common sense amplification unit, and the second operation control signal indicates an end point of the over-driving operation.

13. The semiconductor memory device of claim 11, wherein the first operation control signal indicates a start point of an over-driving operation of the common sense amplification unit, and the second operation control signal indicates a start point of a normal-driving operation of the common sense amplification unit.

14. The semiconductor memory device of claim 8, wherein the common sense amplification unit is configured to receive the data in correspondence with the first and second memory banks through a plurality of global lines.

15. A semiconductor memory device, comprising:
   a plurality of memory banks disposed in a core region, wherein the memory banks each comprise a plurality of memory cell arrays;
   a plurality of sense amplification units disposed in the core region and corresponding to the memory banks, respectively, wherein the sense amplification units are each configured to sense data corresponding to a selected memory cell and amplify the sensed data;
   a common delay unit disposed in a peripheral region and commonly coupled to the memory banks, wherein the common delay unit is configured to receive a plurality of bank active signals, delay a selected one of the plurality of bank active signals by a common delay time using a common delay path, and generate the delayed bank active signal as a first operation control signal for controlling a first operation timing point of a respective one of the sense amplification units and wherein each of the plurality of bank active signals activates a corresponding one of the memory banks; and
   a plurality of individual delay units disposed between the common delay unit and the sense amplification units, respectively, and configured to each delay the first operation control signal by an individual delay time and generate the delayed first operation control signal as a second operation control signal for controlling a second operation timing point of the respective sense amplification unit,
   wherein the common delay unit comprises:
      a common input unit configured to receive the bank active signals; and
      a delay having an input and an output and configured to delay an output signal of the common input unit by a predetermined time to output the delayed signal as the first operation control signal, wherein an output node of the delay is coupled to inputs of all of the sense amplification units to supply the operation control signal.

16. The semiconductor memory device of claim 15, wherein the common delay unit comprises a transfer unit configured to transfer the respective delayed signal of the common delay unit to a corresponding sense amplification unit as the operation control signal in response to the bank active signals.

17. The semiconductor memory device of claim 15, further comprising a delay control unit configured to generate a delay control signal for controlling a time delayed in the common delay unit and each of the individual delay units.

18. The semiconductor memory device of claim 15, wherein the first operation control signal indicates a start point of an over-driving operation of the respective sense amplification unit and the second operation control signal indicates an end point of the over-driving operation.

19. The semiconductor memory device of claim 15, wherein the first operation control signal indicates a star point of an over-driving operation of the respective sense amplification unit and the second operation control signal indicates a start point of a normal-driving operation of the respective sense amplification unit.

20. The semiconductor memory device of claim 15, wherein the common delay unit reflects a common delay time of each of a plurality of operation control signals comprising the first and second operation control signals.

* * * * *